United States Patent [19]

Bailey

[11] Patent Number: 4,641,115

[45] Date of Patent: Feb. 3, 1987

[54] RADIO FREQUENCY CHOKES HAVING TWO WINDINGS AND MEANS FOR DAMPENING PARASITIC RESONANCES

[75] Inventor: Peter D. Bailey, Phoenix, Ariz.

[73] Assignee: Texscan Corporation, Phoenix, Ariz.

[21] Appl. No.: 617,013

[22] Filed: Jun. 4, 1984

[51] Int. Cl.⁴ .............................................. H03H 7/09
[52] U.S. Cl. .................................. 333/181; 333/185;
333/245; 336/183; 336/195; 323/353
[58] Field of Search ............... 333/245, 181, 185, 177,
333/172, 175, 132, 131; 336/105, 155, 160, 170,
173, 177, 180, 181, 183, 186, 187, 188, 195;
323/353

[56] References Cited

U.S. PATENT DOCUMENTS

| | | | |
|---|---|---|---|
| 2,692,372 | 10/1934 | Goldstine | 333/181 |
| 2,791,646 | 5/1957 | Keroes | 336/183 X |
| 3,295,055 | 12/1966 | Matsushima et al. | 336/83 X |
| 3,590,329 | 6/1971 | Krepps, Jr. | 336/183 X |
| 3,980,975 | 9/1976 | Maxon, Jr. et al. | 333/185 |
| 3,982,814 | 9/1976 | Kaiserwerth et al. | 336/180 X |
| 4,394,631 | 7/1983 | Pavlic | 333/175 X |

FOREIGN PATENT DOCUMENTS

122396  9/1966  Fed. Rep. of Germany ...... 333/175

Primary Examiner—Paul Gensler
Assistant Examiner—Benny Lee
Attorney, Agent, or Firm—Herbert E. Haynes, Jr.

[57] ABSTRACT

Radio frequency chokes for use in combining and separating radio frequency signals and single phase AC power in the equipment used in cable transmission and distribution systems. The radio frequency chokes include a conductor wound on a magnetic core to form a primary winding upon which first and second swamping circuits are mounted. Each of the swamping circuits include a secondary winding with a resistor connected across the ends thereof with the swamping circuits effectively dampening parasitic resonances in the primary winding which occur in the frequeny range of from about 5 MHz to at least 800 MHz.

31 Claims, 9 Drawing Figures

RADIO FREQUENCY CHOKES HAVING TWO WINDINGS AND MEANS FOR DAMPENING PARASITIC RESONANCES

BACKGROUND OF THE INVENTION

1. Field of the Invention

This invention relates in general to the art of the cable transmission and distribution of broadband radio frequency signals and more particularly to improved radio frequency chokes for use in the circuits of various transmission and distribution equipment for separating and combining broadband radio frequency signals and single phase AC power signal which are simultaneously transmitted in the same cable.

2. Description of the Prior Art

In the art of the cable transmission and distribution of radio frequency (RF) signals, such as television signals, and the like, it is a common practice to simultaneously transmit a broadband of RF signals and a single phase AC power signal in the same coaxial cable with such simultaneous transmission being commonly referred to as frequency diplexing.

In a typical cable system, the RF signals originate or are transmitted from a central location known as the "headend". The coaxial cables used to carry the RF signals inherently have loss characteristics and amplifier stations are installed at appropriate locations along the cable to compensate for the losses and return the signal levels as closely as possible to what they were at the headend. The single phase AC power signal, which in most instances in the United States is 60 Hz, is needed to operate the amplifier stations and the AC power signal is introduced, or coupled, into the coaxial cable at appropriate locations and will travel along the cable with the RF signals. The single phase AC power signal is at a power level which is approximately 50,000 times greater than that of the RF signals, and must use different and separate circuitry to accomplish their totally different functions. Therefore, the single phase AC power signal must be separated from the RF signals within each amplifier station.

Other equipment is also used, in addition to the amplifier stations, in cable systems for distribution of the RF signals according to subscriber requirements. This other equipment is passive, i.e., it does not need the single phase AC power signal for operation. However, the passive equipment must be able to pass and distribute the AC power signal without interfering with the various operations that relate to the RF signals.

In the amplifier stations which must use the single phase AC power signal and in the passive equipment which must pass or distribute the AC power signals, special circuits are employed for separating the RF signals from the AC power signal. Also, the equipment used in the cable system for introducing, or coupling, the single phase AC power signal into the system employs special circuits, similar to the separating circuits mentioned above, which operate to combine the AC power signal and the RF signals. The special circuits will hereinafter be collectively referred to as the frequency diplexing circuits for clarity of this description.

One of the main problems with cable systems results from cascading of the many similar circuits used in the equipment provided along the length of the cable system. Each piece of the various types of equipment will have a characteristic frequency response, and it is desirable that each piece of equipment be capable of maintaining the relative level of all of the RF signals to each other. That is, the relative levels of the RF signals at the output end of each piece of the equipment should ideally be identical with the relative levels at the input end. This is often referred to as a "flat" response and means that the equipment is not contributing unwanted variations in signal levels regardless of the frequency of the signal. In actuality, circuits do not have perfectly "flat" frequency responses and degradation of the "flat" response becomes a bigger problem at higher frequencies and as the bandwidth of frequencies increases. In equipment of the same make, flatness degradations are usually of the same type and occur at about the same spot in the RF bandwidth. When the equipment is cascaded, the flatness degradations are cumulative and cause what is called a "signature". If the cascade is long and the flatness degradation of a single unit is large enough, the end-of-the-line flatness degradation will be unacceptably high causing severe deterioration of signal quality. Therefore, one of the objectives in equipment design is to keep flatness degradations to a minimum.

The frequency diplexing circuits used in the hereinbefore described cable equipment are by function and necessity in the main RF signal path of the cable system, and radio frequency (RF) chokes are the primary components in these frequency diplexing circuits because all the single phase AC current passes through them and they are connected directly to the RF signal path.

As is well known, an RF choke is an inductor which exhibits a high reactance or impedance to signals in the RF frequency range and low impedance to signals of lower frequency. In cable systems today, the frequency range of RF signals is from about 5 to 450 MHz. The RF chokes employed as described above in the cable transmission and distribution systems presents a high impedance to those frequencies of the RF signals, and offers virtually no impedance to the lower frequency single phase AC power circuit. This inherent characteristic of RF chokes makes them useful in the separation and combining of RF signals and single phase AC power signals. For example, if such an RF choke were connected with one end tied to the main line carrying both RF signals and AC power signals, and the other end tied to an AC input of a power supply, its function, ideally, would be to provide a low impedance path for the AC power signals to the power supply while presenting a very large impedance to the high frequency radio frequency signals. The result would be that the AC power signal is diverted to the power supply while the RF signals would continue completely unaffected. It should be stated that the separating function described above can only be fully effected by the RF choke in conjuncton with other components of the circuit.

Traditional RF chokes, unfortunately, do not offer a uniformly high impedance to all frequencies in the bandwidth of RF signals from 5 to 450 MHz. As is known, most so called traditional RF chokes consists of several turns of insulated wire wound around a ferromagnetic core. In cable systems, in order to maintain a sufficiently high inductive reactance, or impedance at the 5 MHz end of the frequency band, the RF chokes must have a relatively large number of turns of wire. Due to the physical configuration of these RF chokes, parasitic capacitances exist between the windings of the coil. These capacitances in conjunction with the inductance of the coil form parasitic resonances, most of which are series resonances. The presence of series resonances, along portions of the RF choke, cause significant reductions in its impedance at the resonant frequencies. The Q of these resonant circuits is high enough to cause significant and oftentimes sharp degradations in equipment flatness, and the RF signals are undesirably effected thereby.

Traditional chokes of the type described briefly above can perform well in cable systems having an upper frequency limit of approximately 220 MHz. However, increasing usage of such cable systems results in the need for wider bandwidths and these traditional RF chokes simply do not perform well at higher frequencies.

In addition to the effects on frequency response, the RF chokes used in the equipment of the cable system must be capable of passing several amperes of AC current. The wire used for the coil must, therefore, be large enough to carry relatively high currents, usually up to about 14 amperes in such cable transmission systems, without becoming excessively warm. Unfortunately, the larger the wire size the more troublesome is the parasitic resonance problem. High currents also pose problems in that core materials are likely to approach saturation thereby presenting the RF signals with an impedance which varies at the frequency rate of the single phase AC power signal. The effect of this is the unwanted modulation of RF signals and this problem is commonly referred to as "hum mod".

The above described problems due to high AC current can be effectively reduced by careful selection of wire size, core material, and core geometry. Unfortunately, solutions to these problems aggravate the parasitic resonance problem. Techniques have evolved to minimize the effects of these parasitics and are generally effective for use in cable systems which carry RF signals in the range of about 5 to 450 MHz. All of these techniques consist for the most part in reducing the Q of the parasitic resonances thereby turning sudden, sharp, and deep impedance variations into slow, smooth, and shallow variations. This is sometimes referred to in the art as "swamping".

Effective broadband suppression of parasitic resonances seem to be possible only through some sort of "swamping" technique, and as might be suspected, something must be sacrificed to obtain a flat response in this way. What swamping does, essentially, is increase the impedance of the choke at those frequencies where parasitic resonances occur and decrease the impedance of the choke at all other frequencies. The objective of good swamping design is to maximize the former and minimize the latter, and in such a way as to render an overall uniform impedance across the entire bandwidth of frequencies.

As mentioned earlier, there are techniques that have been used to give good performance in the frequency range of about 5 to 450 MHz. U.S. Pat. No. 4,394,631, for example, discloses a special RF choke which has proven to work well in this bandwidth. Briefly, this special prior art RF choke is disclosed as having a current carrying capacity of 10-12 amps with peak current as high as 15 amps, and is provided with a ferrite core having a diameter of 0.250 inches with a permeability suitable for the transmission of RF signals in the range of about 5 to 400 MHz. An 18 gage wire is wound around the core to provide a coil having 21 turns and a first RF resistor, in the form of a bead, is concentrically mounted on the seventh turn from one end of the coil. A second, or shunt resistor is connected in parallel between the opposite end of the coil and the seventh turn from the opposite end of the coil. The addition of the first resistor, i.e., the bead, adds a series impedance to the inductance of the RF choke. This, in conjunction with placement of the shunt resistor, results in a relatively efficient dampening, or swamping, of the parasitic series resonances in the RF choke so that it presents comparatively smooth variations in the impedance to the RF signals in the frequency range of about 5 to 450 MHz. However, above 450 MHz the uniformity of the impedance has been found to degrade significantly.

Current demands on cable system capabilities are continually increasing and the need for extended bandwidths and upper frequency limits beyond 550 MHz is imminent. Therefore, a need exists for a new and improved RF choke which overcomes some of the problems and shortcomings of the prior art.

SUMMARY OF THE INVENTION

In accordance with the present invention, new and improved rf chokes are disclosed for use in the various types of equipment used in cable systems over which RF signals, such as cable television signals, are transmitted and distributed. The RF chokes are used in frequency diplexing circuits, i.e., the circuits which separate, and in similar circuits which combine, single phase AC power signals and the RF signals which are transmitted in the same coaxial cable of the cable system. The RF chokes of the present invention have proven to be effective and efficient in a frequency range of about 5 MHz to about 800 MHz and in some instances even higher.

In a first embodiment of the present invention, an RF choke is disclosed for use in the frequency diplexing circuits of the equipment used in a cable system in which the signals are transmitted in a bandwidth of from about 5 MHz to about 450 MHz. This first RF choke embodiment includes a core with a conductive wire wound therearound to form what will hereinafter be referred to as a primary winding. The primary winding has its opposite ends extending from the core in the usual manner with one of those ends being for connection to the signal path with that end being commonly referred to in the art as the "hot" end of the RF choke, and the opposite end of the primary winding is referred to as the ground, or "cold" end of the RF choke. A swamping circuit is provided on the RF choke of this first embodiment which includes a secondary winding of conductive wire which is also wound around the core and has fewer turns of conductive wire than the primary winding, and is located proximate the "cold" end of the RF choke. The extending ends of the secondary winding of this swamping circuit are interconnected by a resistor of predetermined value.

In a second embodiment of the present invention, the RF choke is configured for use in frequency diplexing circuits that are employed in the cable equipment of cable systems in which the RF signals are transmitted in the significantly expanded bandwidth of from about 5 MHz to about 800 MHz, and higher. This second embodiment of the RF choke has the primary winding wound around the core in the manner described above with reference to the first embodiment of the RF choke of the present invention, and similarly, has the swamping circuit mounted thereon. In addition, a second swamping circuit is mounted on this RF choke and includes a secondary winding having fewer turns than the primary winding and which is located intermediate the first swamping circuit and the "hot" end of the RF choke. The opposite ends of the secondary winding of the second swamping circuit are interconnected by a resistor of predetermined value.

Exactly how the RF chokes of the present invention work is not totally understood, but the theory of operation is believed to be as follows. Two distinguishable and interacting phenomena appear to be taking place, namely, inductive coupling and capacitive coupling of the physically separated resistance to the inductance determining primary winding of the RF chokes.

Inductive coupling is predominant in the frequency range of from about 5 MHz to about 200 MHz and gradually diminishes in effect as the frequency increases and is no longer significant at about 400 MHz. Over this effective frequency range, the inductive coupling appears to produce a transformer action which reflects the resistance value as a very high resistance that is distributed evenly across the primary winding. This produces efficient and smooth swamping of parasitic resonances in this frequency range.

The capacitive coupling is predominant for frequencies above about 500 MHz and gradually diminishes in effect as the frequency decreases and is no longer significant at frequencies of about 250 MHz. Over this effective frequency range, the capacitance existing between the primary winding and the secondary windings of both of the swamping circuits apparently couples the resistors of those swamping circuits to portions of the primary winding effectively putting resistance in series with the RF choke. The capacitive coupling phenomenon provides efficient and smooth swamping of parasitic resonances in this higher frequency range and, in conjunction with the hereinbefore discussed inductive coupling phenomenon, provides the RF chokes of the present invention with effective and smooth dampening of parasitic resonances over the significantly expanded bandwidth of from about 5 MHz to about 800+ MHz.

The particular functional application and cable system requirements, i.e., frequency bandwidth, upper frequency limit, cascadeability, AC current handling capacity, and the like, will determine the exact configuration of the RF choke which is ideally suited for that particular application and system requirements. In general, the first embodiment of the RF choke of the present invention is suitable for use in the frequency diplexing circuits of equipment used in cable systems having narrow bandwidths and low AC current. And, the second embodiment of the RF choke is ideally suited for use in frequency diplexing circuitry of cable systems over which the significantly expanded bandwidths are transmitted and have relatively high AC current.

The physical manner in which the secondary windings of the first and second swamping circuits are mounted on the RF chokes allows them to be easily moved for adjustment purposes to determine optimum performance for each functional application. Once the exact position for optimum performance has been determined for a particular functional application, all the subsequently manufactured RF chokes which are to be employed for that particular functional application can be easily and reliably duplicated.

As hereinbefore mentioned, the current carrying capacities of RF chokes must be considered in addition to their frequency response. Since the current carried in the main, or trunk-line, of some cable transmission systems is in the range of 10-12 amps, with peak currents up to as high as 15 amps, the following detailed description of a particular configuration of one of the RF chokes of the present invention will be understood to have a current carrying capacity in this range and that for lower current carrying capacity requirements, some of the following parameters may change.

Therefore, by way of example, if the RF choke of the present invention is to be configured for use in the significantly expanded bandwidth of from about 5 MHz to about 800 MHz, or higher, and is to have a current carrying capacity of about 10-12 amps, the following configuration of the RF choke is found to be ideal. The core is formed of a material having an initial permeability of about 125, and a saturation flux density of about 3300 gauss. The core is 1.2 inches long and has a cross sectional area of about 0.05 square inches. 18 Gage conductive wire is wound around the core to provide the primary winding with 18 turns, with one extending end of the wire being for connection to the RF ground, or "cold" end of the RF choke, and the opposite extending end is for connection to the signal path over which the AC power signals and the RF signals are transmitted, with this being referred to as the "hot" end.

The secondary winding of the first swamping circuit is formed of 22 gage conductive wire which is wound to provide three turns, with the individual turns being preferably alternately arranged between the second, third, fourth, and fifth turns of the primary winding respectively as counted from the cold end of the choke. The opposite extending ends of the secondary winding of this first swamping circuit are interconnected by a 120 ohm ⅛ watt resistor. The secondary winding of the second swamping circuit is also formed of 22 gage conductive wire which is wound to provide two turns with the indivicual turns being preferably alternately arranged between the tenth, eleventh and twelfth turns of the primary winding respectively as counted from the cold end of the RF choke. The opposite extending ends of the secondary winding of this second swamping circuit are also interconnected by a 120 ohm ⅛ watt resistor.

By providing the first and second swamping circuits, which are believed to couple their respective resistors to the primary winding in the manner discussed above, the RF chokes of the present invention have high current carrying capacity and good hum-mod performance while providing effective and efficient dampening of parasitic series resonances in the significantly expanded frequency range of from about 5 MHz to about 800 MHz, and higher, with minimal RF signal deterioration and losses in cable transmission and distribution systems.

Accordingly, it is an object of the present invention to provide new and improved RF chokes for use in the frequency diplexing circuits of the various types of equipment used in cable transmission and distribution systems over which AC power signals and broadband RF signals are simultaneously transmitted in the same cable.

Another object of the present invention is to provide new and improved RF chokes for use in the frequency diplexing circuits of the various types of cable equipment used in cable transmission and distribution systems over which AC power signals and broadband RF signals are simultaneously transmitted in the same cable with the RF signals being transmitted in the broadband frequency range of from about 5 MHz to about 800 MHz and higher.

Another object of the present invention is to provide new and improved RF chokes of the above described character which effectively and efficiently dampen, or swamp parasitic series resonances in the RF choke over the broadband frequency range of from about 5 MHz to about 800 MHz, and higher, while maintaining RF choke performance and minimizing signal deterioration.

The foregoing and other objects of the present invention as well as the invention itself, may be more fully understood from the following description when read in conjunction with the accompanying drawings.

Description of the Preferred Embodiments

The radio frequency (RF) chokes of the present invention, which will hereinafter be described in detail, are primarily intended for use in the frequency diplexing circuits of the various types of equipment used in cable transmission and distribution systems over which radio frequency signals and single phase AC power signals are simultaneously transmitted.

Figures 1, 2, 3, 5, 8, 9:
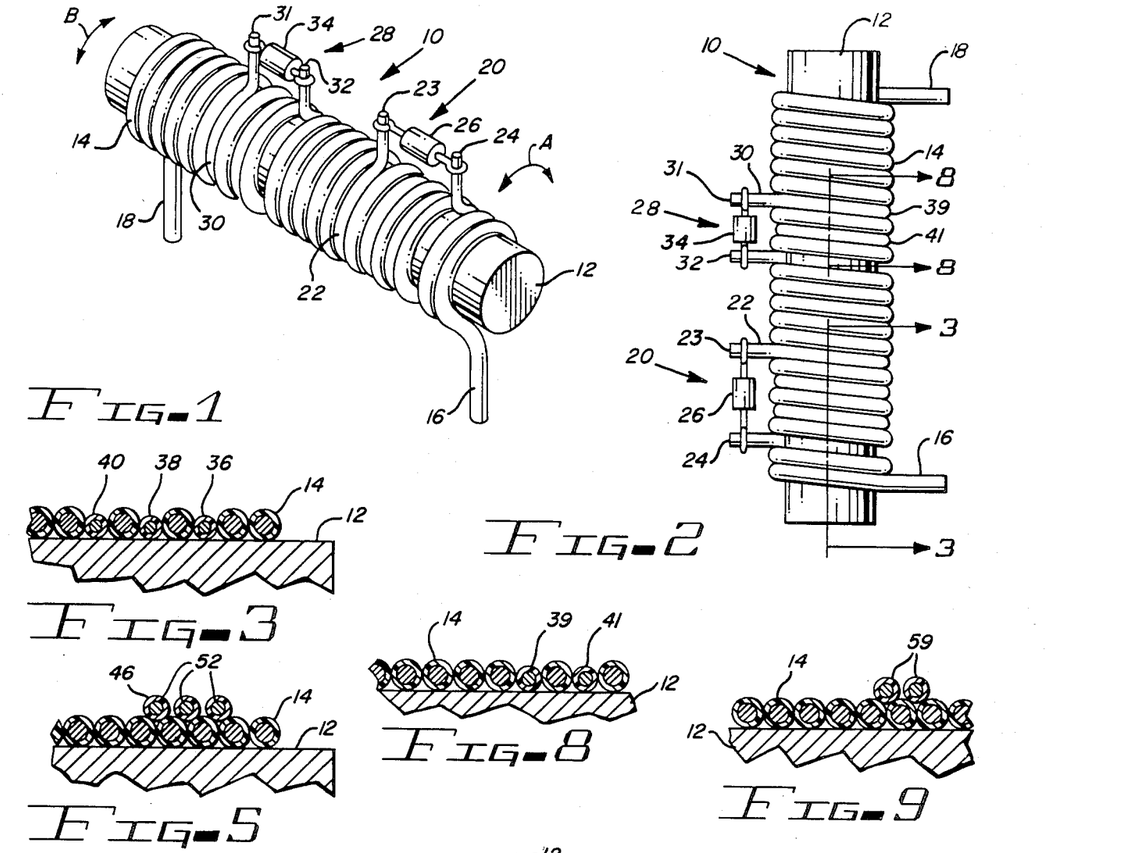
FIG. 1 is a perspective view of one embodiment of the rf chokes of the present invention showing the various features thereof.
FIG. 2 is an enlarged orthographic view of the RF choke shown in FIG. 1.
FIG. 3 is an enlarged fragmentary sectional view taken along the line 3—3 of FIG. 2.
FIG. 5 is an enlarged fragmentary sectional view taken along the line 5—5 of FIG. 4.
FIG. 8 is an enlarged fragmentary sectional view taken along the line 8—8 of FIG. 2.
FIG. 9 is an enlarged sectional view taken along the line 9—9 of FIG. 4.

Referring more particularly to the drawings, FIGS. 1 and 2 illustrate a first embodiment of the RF choke of the present invention which is indicated generally by the reference numeral 10. The RF choke 10 includes a core 12 which is formed of a preselected magnetic material and a conductive wire of suitable gage is wound on the core 12 to form a primary winding 14 having a predetermined number of turns. One of the extending ends 16 of the primary winding 14 is intended for coupling to ground and is thus hereinafter referred to as the ground or "cold" end of the RF choke as it is sometimes referred in the art. The other extending end 18 of the primary winding is intended for coupling to the cable (not shown) over which the RF signals and the AC power signals are transmitted with this end being hereinafter referred to as the cable, or "hot" end of the RF choke.

The RF choke 10 further includes a first swamping circuit 20 which is located in a predetermined location proximate the ground end 16 of the choke. As will hereinafter be described in detail, the swamping circuit 20 functions to swamp, or dampen, the parasitic resonances which inherently occur in all RF chokes in the relatively low frequency range of the bandwidth of the RF signals that are being transmitted over the cable to which the RF choke 10 is coupleable. The first swamping circuit 20 includes a secondary winding 22 formed of a predetermined gage of conductive wire which is wound about the core 12 to provide a predetermined number of turns. The extending ends 23 and 24 of the secondary winding 22 are interconnected by a resistor 26 of preselected value.

A second swamping circuit 28 is provided on the RF choke 10 in a predetermined location intermediate the first swamping circuit 20 and the cable end 18 of the primary winding 14 of the choke. The second swamping circuit 28, as will hereinafter be described in detail, functions to swamp, or dampen the parasitic resonances which occur in the relatively higher frequency range of the bandwidth of the RF signals that are being transmitted over the cable to which the RF choke 10 is coupleable. The second swamping circuit 28 includes a secondary winding 30 formed of a predetermined gage of conductive wire that is wound a predetermined number of times around the core 12. The extending ends 31 and 32 of the secondary winding 30 are interconnected by a resistor 34 of predetermined value.

As is well known, cable transmission and distribution systems will vary with regard to the bandwidth of the RF signals that are transmitted thereover, the AC current carrying capacity, and the like. Such cable system variables will effect the configuration of the RF chokes that are suitable for use in the frequency diplexing circuits of the equipment which forms part of particular cable systems.

Therefore, the following description of a particular cable system and a specific configuration of the above described RF choke 10 suitable for use therein, is presented for completeness of this disclosure and is intended as an example rather than a limitation of the present invention.

A typical cable transmission and distribution system over which cable television signals are transmitted will, as hereinbefore discussed, simultaneously carry single phase AC power signals which, at least in the United States, is at a frequency of 60 Hz, and has a current value of about 10–12 amps, with peak currents up to about 15 amps. In many cable television systems in use today, the bandwidth of the RF signals is from about 5 MHz to about 400–450 MHz. However, increasing demands are being placed on such cable television transmission and distribution systems, and it is anticipated that the bandwidth will be expanded to from about 5 MHz to about 800 MHz, or more. Therefore, that significantly expanded bandwidth will be considered as being one of the variables of the typical cable television transmission and distribution system of the example being presented.

The RF choke 10 suitable for use in the above described cable system has been found to have the proper frequency response, current carrying capability, good hum-mod performance, and the like, when specifically configured as follows. The core 12 is formed of a magnetic material having an initial permeability of about 125 and a flux density of about 3300 gauss. The core 12 is about 1.2 inches in length, has a cross sectional area of about 0.05 inches square, and is preferably cylindrical. Magnetic cores having these characteristics are commercially available with one source thereof being the National Moldite Co., 250 South Street, Newark, N.J., 07114, with the cores being identified by this company as Q1.

The insulated conductive wire of which the primary winding 14 is formed is of eighteen gage and is wound around the core 12 to provide eighteen turns. The conductive wire, also insulated, of which the secondary winding 22 of the first swamping circuit 20 is formed, is twenty-two gage wire that is wound around the core to form three turns. As seen best in FIG. 3, the three turns of the secondary winding 22 of the first swamping circuit 20 are in contiguous contact with the peripheral surface of the core 12 and are alternately arranged so that the first turn 36 lies between the second and third turns of the primary winding 14 as counted from the ground end 16 thereof. The second turn 38 of the secondary winding 22 similarly lies between the third and fourth turns of the primary winding 14 and the third turn 40 of the secondary winding 22 lies between the fourth and fifth turns of the primary winding 14. The extending ends 23 and 24 of the secondary winding 22 are interconnected by the resistor 26 which is a 120 ohm ⅛ watt resistor.

The secondary winding 30 of the second swamping circuit 28 is formed of twenty-two gage conductive wire which is wound around the core 12 to form two turns. The two turns of the secondary winding 30 are in contiguous contact with the peripheral surface of the core 12 in the same manner as described above, with reference to the secondary winding 22 of the first swamping circuit 20. The two turns 39 and 41 of the secondary winding 30 are alternately arranged between the tenth, eleventh and twelfth turns of the primary winding 14 is counted from the ground end 16 thereof, as seen best in FIG. 8.

The specific details presented above provide the RF choke with the characteristics that are ideally suited for use in the frequency diplexing circuits of the equipment of the specific cable television transmission and distribution system of this example. However, as hereinbefore mentioned, exactly what occurs in the RF choke 10 is unknown. It is believed that two separate but interacting phenomena take place, namely, inductive and capacitive coupling of the physically separated resistance to the primary winding of the choke.

The inductive coupling phenomenon appears to be predominant in the frequency range of from about 5 MHz to about 200 MHz and gradually diminishes in effect as the frequency increases, and is no longer significant at about 400 MHz. In this effective frequency range, the inductive coupling apparently produces a transformer action which reflects the value of the resistance as a very high resistance which is distributed evenly across the primary winding.

The capacitive coupling phenomenon appears to be predominant for frequencies above 500 MHz, and gradually diminishes in effect as the frequency decreases and is no longer significant at frequencies of about 250 MHz. In this effective frequency range, the capacitance existing between the primary winding 14 and the secondary windings 22 and 30 of the first and second swamping circuits 20 and 28, respectively, apparently couples the resistors 26 and 34 thereof to portions of the primary winding 14, which, in effect, puts the resistances in series with the RF choke.

The inductive coupling phenomenon provides efficient and smooth swamping of the parasitic resonances at the lower end of the significantly expanded bandwidth of from about 5 MHz to about 800 MHz, and above. The capacitive coupling phenomenon provides similar swamping of the parasitic resonances at the higher end of that bandwidth and an interacting, or overlapping, of these two phenomena accomplishes the swamping in the intermediate portions of the bandwidth.

As mentioned above, the variables of the particular cable system in which the RF chokes of the present invention are to be used has an effect on the configuration of the chokes. To illustrate this point more clearly, consider a cable system wherein the AC current is lower than the 10–12 amps of the example hereinbefore presented. The current carrying capacity of RF chokes usable in the frequency diplexing circuits of such a cable system having lower AC current, may be reduced by reduction of the gage of the wire used to form the primary winding from eighteen gage to, for example, twenty gage. Further, if the lower end of the bandwidth of the RF signals transmitted over a cable system is raised from 5 MHz to, for example, 30–50 MHz, the number of turns of the primary winding can be reduced.

Figure 4:
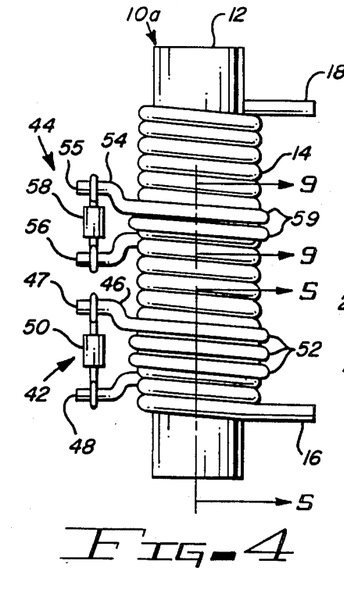
FIG. 4 is a view similar to FIG. 2 and showing a modification of this embodiment of the RF chokes of the present invention.

Reference is now made to FIGS. 4 and 5 wherein a modification of the RF choke 10 is illustrated, with the modified rf choke being identified in its entirety by the reference numeral 10a. The RF choke 10a is identical to the RF choke 10 with regard to the core 12 and the primary winding 14. The difference between the two RF chokes 10 and 10a is in the first and second swamping circuits of the choke 10a which are indicated generally in FIG. 4 by the reference numerals 42 and 44, respectively.

The first swamping circuit 42 of the RF choke 10a includes the secondary winding 46 which is formed of a preselected gage of insulated conductive wire which is wound to provide a predetermined number of turns. The extending ends 47 and 48 of the secondary winding 46 are interconnected by a resistor 50 of predetermined value. As seen best in FIG. 5, the individual turns 52 of the secondary winding 46 do not lie on the peripheral surface of the core 12 but are instead wound concentrically around and on top of the primary winding 14 so as to lie in the helical groove between adjacent turns of the primary winding 14.

The second swamping circuit 44 of the RF choke 10a includes a secondary winding 54 which is formed of a preselected gage of conductive wire which is wound around to provide a predetermined number of turns. The extending ends 55 and 56 of the secondary winding 54 are interconnected by a resistor 58 of preselected value. As described above with regard to the first swamping circuit 42, the individual turns 59 of the secondary winding 54 are concentrically wound on top of the primary winding 14 so as to lie in the helical groove between selected pairs of adjacent turns of the primary winding 14 as seen best in FIG. 9.

The first swamping circuit 42 is located proximate the ground end 16 of the primary winding 14 of the rf choke 10a, and the second swamping circuit 44 is located intermediate the first swamping circuit 42 and the cable end 18 of the primary winding 14. The RF choke 10a is believed to work in the same manner as the rf choke 10, and therefore, it is felt that repeating of the operation is unnecessary. It will be noted, however, that although the chokes 10 and 10a appear to operate in the same manner, the performance of the RF choke 10a is not quite as good as that of the RF choke 10.

Many of the RF signals that are transmitted over cable transmission and distribution systems today are not in the expanded bandwidth discussed above, but are instead in the considerably smaller bandwidth of from about 5 MHz to about 400 MHz. In such cable systems, a second embodiment of the RF chokes of the present invention may be used.

Figure 6:
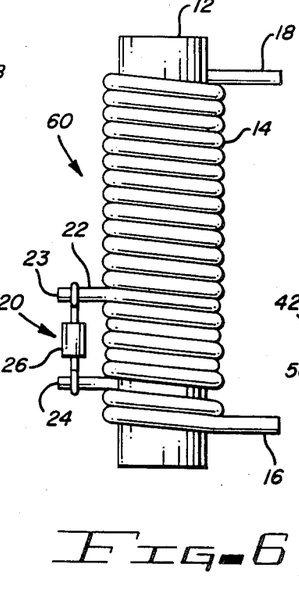
FIG. 6 is an orthographic view of another embodiment of the RF chokes of the present invention.

FIG. 6 shows the RF choke 60 of the second embodiment as being similar to the hereinbefore fully described RF choke 10 with regard to the core 12, primary winding 14 and the swamping circuit 20. In other words, the RF choke 60 does not have the second swamping circuit 28 of the RF choke 10.

Figure 7:
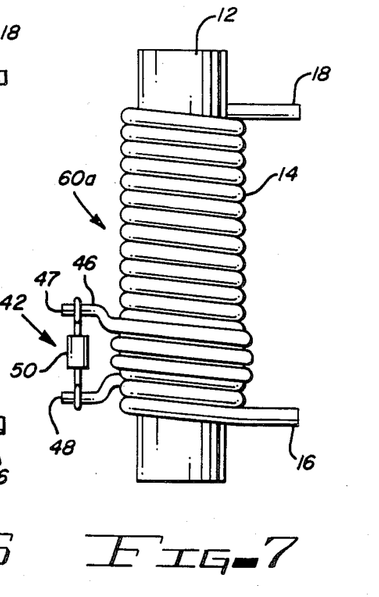
FIG. 7 is a view similar to FIG. 6 and showing a modified form of this other embodiment of the present invention.

FIG. 7 shows a modified form of the second embodiment of the RF choke of the present invention, with this modified RF choke being indicated generally by the reference numeral 60a. The RF choke 60a is similar to the hereinbefore described RF choke 10a with the single exception that choke 60a does not have the second swamping circuit 44.

As was the case with the RF chokes 10 and 10a, the RF choke 60a does not perform quite as well as the RF choke 60 but both of these chokes 60 and 60a effectively and smoothly swamp the parasitic resonances in cable systems over which RF signals are transmitted in the currently used bandwidths of from about 5 MHz to about 400 MHz.

The manner in which the secondary winding of the swamping circuits of the above described RF chokes are wound on the core in the preferred embodiments and in the helical grooves of the primary winding of the other embodiments, allows the swamping circuits to be manually rotatably moved about the longitudinal axis of the core as indicated by arrows A and B in FIG. 1. Such rotational movements will alter the performance characteristics of the RF chokes and this is employed to determine the optimum performance of the chokes for each functional application thereof. This may be described as a premanufacturing test, or adjustment, in that once the exact rotational position of the swamping circuit, or circuits, is determined for a particular functional application, all subsequently manufactured RF chokes for that particular application can be easily and reliably duplicated.

While the principles of the invention have now been made clear in the illustrated embodiments, there will be immediately obvious to those skilled in the art, many modifications of structure, arrangements, proportions, the elements, materials, and components used in the practice of the invention, and otherwise, which are particularly adapted for specific environments and operation requirements, without departing from those principles. The appended claims are therefore intended to cover and embrace any such modifications within the limits only of the true spirit and scope of the invention.

What I claim is:

1. A radio frequency choke comprising:
   (a) an elongated core of ferromagnetic material;
   (b) a first conductor wound around said core to form a primary choke winding having a predetermined number of turns and having a signal input terminal end and an opposite ground terminal end; and
   (c) at least one swamping circuit means for dampening parasitic resonances in the primary choke winding, said at least one swamping circuit means including,
      I. a second conductor wound around said core to form a secondary winding having fewer turns than said primary choke winding and having first and second extending end terminal, and
      II. a resistor of predetermined value interconnected between said first and second extending end terminal of said secondary winding of said swamping circuit means.

2. A radio frequency choke as claimed in claim 1 wherein the individual turns of the secondary winding of said swamping circuit are alternately disposed between adjacent turns of said primary choke winding.

3. A radio frequency choke as claimed in claim 1 and further comprising:
   (a) said primary choke winding being wound around said core so that the turns of said primary choke winding are in contiguous engagement with the periphery of said core; and
   (b) said secondary winding of said swamping circuit having the individual turns thereof alternately arranged between selected pairs of adjacent turns of said primary choke winding and disposed to be in contiguous engagement with the periphery of said core.

4. A radio frequency choke as claimed in claim 1 and further comprising:
   (a) said first conductor of which said primary choke winding is formed is wound so that the individual turns of said primary choke winding are in contiguous engagement with the periphery of said core and with each other to define a helical groove which extends the length of said primary choke winding; and
   (b) said secondary winding of said swamping circuit having its turns lying in the helical groove defined by said primary choke winding.

5. A radio frequency choke for use in the frequency diplexing circuits of the equipment of a cable transmission and distribution system over which radio frequency signals and single phase AC power signals are simultaneously transmitted, said radio frequency choke comprising:
   (a) an elongated core of ferromagnetic material;
   (b) a first conductor wound around said core to form a primary choke winding having a predetermined number of turns and having a first end terminal for coupling said primary choke winding to ground and a second opposite end terminal for coupling said primary choke winding to the cable system;
   (c) a first swamping circuit means for dampening parasitic resonances which occur in said primary choke winding at the low end of the frequency bandwidth of the radio frequency signals which are transmitted over the cable system, said first swamping circuit means including,
      I. a second conductor wound around said core to form a first secondary winding having a predetermined number of turns which are fewer than the number of turns of said primary choke winding and having first and second end terminals, and
      II. a first resistor having a first predetermined value interconnected between the first and second end terminals of the first secondary winding of said first swamping circuit means; and
   (d) a second swamping circuit means for dampening parasitic resonances which occur in said primary choke winding at the high end of the frequency bandwidth of the radio frequency signals which are transmitted over the cable system, said second swamping circuit means including,
      I. a third conductor wound around said core to form a second secondary winding having a predetermined number of turns which are fewer than the number of turns of said primary choke winding and having first and second end terminals, and II. a second resistor having a second predetermined value interconnected between the first and second end terminals of the second secondary winding of said second swamping circuit means.

6. A radio frequency choke as claimed in claim 5 wherein said first swamping circuit means is located proximate the first end terminal of said primary choke winding for dampening the parasitic resonances which occur in said primary choke winding in the range of frequencies of from about 5 MHz to about 400 MHz of the bandwidth of the radio frequency signals which are transmitted over the cable system.

7. A radio frequency choke as claimed in claim 6 wherein said second swamping circuit means is located intermediate said first swamping circuit means and the second terminal end of said primary choke winding for dampening the parasitic resonances which occur in said primary choke winding in the range of frequencies of from about 250 MHz to at least 800 MHz of the bandwidth of the radio frequency signals which are transmitted over the cable system.

8. A radio frequency choke as claimed in claim 5 wherein the first secondary winding of said first swamping circuit means has three turns which are located proximate the first end terminal of said primary choke winding.

9. A radio frequency choke as claimed in claim 8 wherein the second secondary winding of said second swamping circuit means has two turns which are located intermediate the first secondary winding of said second swamping circuit means and the second end terminal of said primary choke winding.

10. A radio frequency choke as claimed in claim 5 wherein the first secondary winding of the first swamping circuit means has three turns which are respectively alternately arranged between the second and third, the third and fourth, and the fourth and fifth turns of said primary choke winding as counted from the first end terminal thereof.

11. A radio frequency choke as claimed in claim 5 wherein the second secondary winding of the second swamping circuit means has two turns which are respectively alternately arranged between the tenth and eleventh, and the eleventh and twelfth turns of said primary winding choke as counted from the first end terminal thereof.

12. A radio frequency choke as claimed in claim 5 and further comprising:
(a) said primary choke winding being wound around said core so that the turns thereof are in contiguous engagement with the outer peripheral surface of said core;
(b) said first secondary winding of said first swamping circuit means having three turns which are respectively alternately arranged between the second and thrid, the third and fourth, and the fourth and fifth turns of said primary choke winding as counted from the first end terminal thereof with each of the three turns of said first secondary winding of said first swamping circuit means being disposed in contiguous contact with the outer peripheral surface of said core; and
(c) said second secondary winding of said second swamping circuit means having two turns which are respectively alternately arranged between the tenth and eleventh, and the eleventh and twelfth turns choke winding as counted from the first end terminal of said primary choke winding, with each of the two turns of said second secondary winding of said swamping circuit means being disposed in contiguous contact with the outer peripheral surface of said core.

13. A radio frequency choke as claimed in claim 5 and further comprising:
(a) said first conductor of said primary choke winding being wound about said core so that the individual turns of said primary choke winding are in contiguous engagement with the outer periphery of said core and with each other to define a helical groove along the length of said primary choke winding;
(b) said first secondary winding of said first swamping circuit means having three turns which lie in the helical groove defined by said primary choke winding so as to be respectively arranged approximately between the second and third, the third and fourth, and the fourth and fifth turns of said primary choke winding as counted from the first end terminal thereof; and
(c) said second secondary winding of said second swamping circuit means having two turns which lie in the helical groove defined by said primary choke winding so as to be respectively arranged approximately between the tenth and eleventh, and the eleventh and twelfth turns of said primary choke winding as counted from the first end terminal thereof.

14. A radio frequency choke as claimed in claim 5 wherein said core is approximately 1.2 inches long, has a cross sectional area of approximately 0.05 square inches and is of cylindrical configuration.

15. A radio frequency choke as claimed in claim 5 wherein said core has an initial permeability of about 125 and a saturation flux density of about 3300 gauss.

16. A radio frequency choke as claimed in claim 5 wherein said conductor which forms said primary winding is of 18 gage and is wound to provide said primary winding with eighteen turns.

17. A radio frequency choke as claimed in claim 5 wherein said first swamping circuit means further comprises:
(a) said second conductor which forms said first secondary winding of said first swamping circuit means being formed of 22 gage conductive wire; and
(b) said resistor of said first swamping circuit means being 120 ohms and ⅛ watt.

18. A radio frequency choke as claimed in claim 5 wherein said second swamping circuit means further comprises:
(a) said third conductor which forms said second secondary winding of said second swamping circuit means being formed of 22 gage conductive wire; and
(b) said resistor of said second swamping circuit means being 120 ohms and ⅛ watt.

19. The radio frequency choke of claim 3 wherein said secondary winding of said at least one swamping circuit means includes all of the individual turns thereof being alternately arranged between selected pairs of adjacent turns of a predetermined portion of said primary choke winding;
said predetermined portion of said primary choke winding including a given number of turns which is significantly less than the total number of turns in said primary choke winding;

said individual turns of said secondary winding being further disposed so as to be in contiguous engagement with the outer periphery of said core; and said secondary winding being DC isolated from said primary choke winding.

20. The radio frequency choke of claim 4 wherein said secondary winding of said swamping circuit means includes means for enabling said secondary winding to be rotatably moved within the helical groove defined by said primary choke winding and about the longitudinal axis of said core for adjusting the performance characteristics of the choke and determining the position for obtaining optimum performance of said choke for each functional application thereof.

21. The radio frequency choke of claim 4 wherein said secondary winding of said at least one swamping circuit means has each of the individual turns thereof lying within a predetermined portion of the helical groove defined by the individual turns of said primary choke winding over a given longitudinal portion thereof; and (a) said given portion of said primary choke winding and said secondary winding including a number of turns which is less than the total number of turns of said primary choke winding.

22. The radio frequency choke of claim 5 wherein at least one of said first and second secondary windings of said first and second swamping circuit means, respectively, is adapted to be rotatably positioned longitudinally along said primary choke winding for altering the performance characteristic of the choke to achieve the location of optimal performance for each given functional application.

23. The radio frequency choke of claim 5 wherein both said first and second secondary windings of said first and second swamping circuit means, respectively, include means for rotatably positioning said first and second secondary windings along the longitudinal axis of the core with respect to said primary choke winding such that said rotational positioning will alter the performance characteristics of the choke and enable said secondary windingly to be accurately positioned so as to achieve optimal performance of the choke for each given functional application.

24. The radio frequency choke of claim 13 wherein at least one of said first and second secondary windings of said first and second swamping circuit means, respectively, is adapted to be rotatably positioned longitudinally along said primary choke winding for altering the performance characteristic of the choke to achieve the location of optimal performance for each given functional application.

25. The radio frequency choke of claim 13 wherein both said first and second secondary windings of said first and second swamping circuit means, respectively, include means for rotatably positioning said first and second secondary windings along the longitudinal axis of the core with respect to the primary choke winding such that rotation positioning will alter the performance characteristics of the choke and enable said secondary windings to be positioned so as to achieve optimal performance of the choke for each given functional application.

26. The radio frequency choke of claim 1 wherein said choke is used over a wide range of frequencies and wherein the turns of said primary choke winding produce parasitic capacitances forming an LC resonant circuit, the "Q" of said LC resonant circuit being significantly greater than 1 and wherein the combination of said resistor across the end terminals of said secondary winding serves to dampen the adverse effects of said parasitic capacitances throughout said frequency range.

27. A radio frequency choke comprising:

(a) an elongated core form;

(b) a first conductive means wound around said elongated core to form a primary choke winding having a predetermined number of turns each of which is in contiguous engagement with the outer periphery of said core and having a signal input terminal end and an opposite ground terminal end;

(c) a swamping circuit means for damping parasitic resonances in the primary choke winding, said swamping circuit means including, a second conductor means wound around said core to form a secondary winding which is DC isolated from said first primary choke winding and has fewer turn than said primary choke winding which are disposed between adjacent turns of said primary choke winding and in contiguous engagement with the outer periphery of said core, said secondary winding having first and second opposite end terminals; and (d) a resistor coupled across the opposite end terminals of said secondary winding of said DC isolated swamping circuit means for substantially eliminating the harmful effect of resonances due to parasitic capacitance throughout a relatively low frequency range such as the RF bandwidth from 5 MHz to 400 MHz.

28. A radio frequency choke comprising:

(a) an elongated core form;

(b) a first conductor wound around said core to form a primary choke winding having a predetermined number of turns, the turns of said primary choke winding being wound about said core so that said turns are in contiguous engagement with the outer periphery of said core and with each other to define a continuous helical groove which extends the length of said primary choke winding, said primary choke winding having a signal input terminal end and an opposite ground terminal end; and (c) a swamping circuit means for dampening parasitic resonances in the primary choke winding, said swamping circuit means including, a second conductor wound about said core to form a secondary winding which is DC isolated from said first primary choke winding, said secondary winding having each of its individual turns lying in the helical groove extending across a predetermined portion of said primary choke winding, the predetermined portion of said primary choke winding including a number of primary turns which is significantly less than the total number of turns in said primary choke coil so that the number of turns in said secondary winding means is significantly less than the total number of turns in said primary choke winding, said secondary winding having first and second opposite end terminals; and a resistor means coupled between the first and second opposite end terminals of said secondary winding of said DC isolated swamping circuit means for reducing the adverse effects of parasitic capacitances in a relatively low radio frequency range from 5 MHz to 400 MHz.

29. The radio frequency choke of claim 28 wherein said secondary winding and said resistor means of said swamping circuit means are rotatably positionable along the helical grooves of said primary choke winding and along the longitudinal axis of said core for enabling said swamping circuit means to be accurately positioned with respect to said primary choke winding for substantially eliminating parasitic resonances at said relatively low frequency range within the bandwidth of RF signals from 5 MHz to 400 MHz.

30. A radio frequency choke for use in the frequency diplexing circuits of the equipment of a cable transmission and distribution system over which radio frequency signals and single phase AC power are simultaneously transmitted, said radio frequency choke comprising:
  (a) an elongated core form;
  (b) a first conductor means wound around said core form as a primary choke winding having a predetermined number of turns and having a signal input terminal end and an opposite ground terminal end;
  (c) a second conductor means wound around said core to form a first secondary winding having a predetermined number of turns which are significantly fewer than the number of turns than said primary choke winding and having first and second opposite end terminals, said first secondary winding being DC isolated from said primary choke winding;
  (d) a first resistor means having a first predetermined value, said first resistor means being coupled between the first and second opposite end terminals of said first secondary winding for producing an inductive coupling effect which produces a transformer action for reflecting the value of said first resistor means as a very high resistance distributed evenly across the primary choke winding, said inductive coupling effect being predominant in the frequency range of operation from 5 MHz to 200 MHz and gradually diminishing in effect as the frequency increases until the inductive coupling effect is no longer significant at frequencies above 400 MHz;
  (e) a third conductor wound about said core to form a second secondary winding having a predetermined number of turns, the number of turns of said second secondary winding being significantly less than the number of turns of said primary choke winding and said second secondary winding having first and second opposite end terminals, said second secondary winding being DC isolated from said primary choke winding; and
  (f) a second resistor means having a predetermined second value, said second resistor means being coupled between the first and second opposite end terminal of said second secondary winding for producing a capacitive coupling effect which is reflected into at portions of the primary choke winding to effectively place additional resistance in series with the RF choke thereby dampening the effect of parasitic resonances at the higher end of the frequency bandwidth, said capacitive coupling effect being predominate for frequencies above 400 MHz and gradually diminishing in effect as the frequency decreases until it is no longer significant in frequencies of below 250 MHz.

31. The radio frequency choke of claim 30 wherein said first and second secondary windings and said first and second resistor means, respectively, means interact over an intermediate portion of the combined frequency ranges to substantially eliminate the harmful effects of parasitic resonance throughout the intermediate frequency range thereby providing a substantially resonance-effect free condition throughout the entire bandwidth of signals from 5 MHz to at least 800 MHz.

* * * * *